United States Patent
Guo et al.

(10) Patent No.: US 7,239,519 B2
(45) Date of Patent: Jul. 3, 2007

(54) ELECTRONIC DEVICE WITH UNIFORM HEAT-DISSIPATION

(75) Inventors: Qing Guo, Taoyuan Hsien (TW); Dong Lin, Taoyuan Hsien (TW); Bao Hua Li, Taoyuan Hsien (TW); Jin Fa Zhang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 11/345,482

(22) Filed: Feb. 1, 2006

(65) Prior Publication Data

US 2007/0070606 A1    Mar. 29, 2007

(30) Foreign Application Priority Data

Sep. 27, 2005    (TW) .............................. 94133601 A

(51) Int. Cl.
*H05K 7/20* (2006.01)
*H05K 9/00* (2006.01)
(52) U.S. Cl. .................. 361/714; 361/816; 361/818
(58) Field of Classification Search ........... 361/714, 361/816, 818
See application file for complete search history.

(56) References Cited

U.S. PATENT DOCUMENTS

| | | | | |
|---|---|---|---|---|
| 5,028,740 A | * | 7/1991 | Tomiya | 174/373 |
| 5,124,889 A | * | 6/1992 | Humbert et al. | 361/818 |
| 5,235,492 A | * | 8/1993 | Humbert et al. | 361/818 |
| 5,461,545 A | * | 10/1995 | Leroy et al. | 361/765 |
| 5,532,427 A | * | 7/1996 | Stoyko | 174/363 |
| 5,864,088 A | * | 1/1999 | Sato et al. | 174/386 |
| 5,920,984 A | * | 7/1999 | Persson et al. | 29/836 |
| 6,031,732 A | * | 2/2000 | Koike et al. | 361/816 |
| 6,313,400 B1 | * | 11/2001 | Mosquera et al. | 174/363 |
| 2005/0206357 A1 | * | 9/2005 | Laurent et al. | 323/282 |
| 2006/0109634 A1 | * | 5/2006 | Lee et al. | 361/720 |

FOREIGN PATENT DOCUMENTS

WO    WO 03/094585 A1 * 11/2003

* cited by examiner

*Primary Examiner*—Michael Datskovsky
*Assistant Examiner*—Robert J. Hoffberg

(57) ABSTRACT

An electronic device with uniform heat-dissipation is disclosed. The electronic device comprises a housing, a circuit board, and a metal shielding. The housing has concavities at inner sides thereof, and the circuit board is disposed within the housing. The metal shielding is disposed between the housing and the circuit board and has protrusions at outer sides thereof to match up the concavities of the housing. Thereby, the metal shielding substantially stays close to the housing for allowing the electronic device to dissipate heat uniformly.

10 Claims, 6 Drawing Sheets

ELECTRONIC DEVICE WITH UNIFORM HEAT-DISSIPATION

FIELD OF THE INVENTION

The present invention relates to an electronic device, and more particularly to an electronic device with uniform heat-dissipation.

BACKGROUND OF THE INVENTION

The portable electronic products or other electronic information products, such as the personal notebook or personal digital assistant, become indispensable electronic products in daily life. Since these electronic products are carried with the user usually, the adapter, power supply and charger are necessary accessories to keep enough power of the electronic products.

Take the adapter as an example. When the adapter is under operation, partial electric power will be consumed. With the technical progress of the electronic product and in response to the requirement of the user, more and more electronic components are loaded on the printed circuit board in the interior of the electronic product, which increases the integration of the electronic components. Therefore, the electric power consumption for the operation of most adapters is increased to 100 to 200 watts, or more than 200 watts. As the watt consumption increases, more and more heat is generated, resulting in the increase of the temperature of the whole adapter.

Please refer to FIG. 1, which is a cross-section view showing the structure of the conventional adapter. The adapter 1 comprises a printed circuit board (PCB) assembly 11 and a housing 12. The PCB assembly 11 comprises a printed circuit board (PCB) 13 and a plurality of electronic components 14, and is covered by a metal cover 15. When the adapter 1 is connected between the electronic product and the commercial power source and under operation, the heat generated from the electronic components 14 in the PCB assembly 11 is conducted all around, so the metal cover 15 can conduct the heat to the housing 12 to be dissipated.

The housing 12 of the adapter 1 is composed of upper and lower housings 121 and 122. Since a draft angle φ is formed to facilitate drafting during the plastic demolding process as manufacturing the upper and lower housings 121 and 122, a concave surface is formed on the inner side surface of the housing 12 after the upper and lower housings 121 and 122 are assembled, which results in that the inner side surface of the housing 12 and the vertical side surface of the PCB assembly 11 cannot conform to and stay close to each other and a space 16 is formed therebetween.

When the heat is generated from the electronic components 14, the heat flow will be toward to the area having lower thermal resistance. Since the space 16 is formed between the inner side surface of the housing 12 and the vertical side surface of the PCB assembly 11 and the thermal conductivity of the air filled in the space 16 is much lower than that of the metal cover 15 close to the top of the housing 12, the thermal resistance at the side areas of the housing 12 is higher than that at the top area of the housing 12. Therefore, the heat flow flows to the top area of the housing 12 in a major proportion, and thus, the temperature at the top surface is higher than those at the side surfaces of the adapter 1, resulting the nonuniform temperature distribution of the adapter.

The nonuniform temperature distribution of the adapter 1 will cause the large temperature difference on side surface and top surface, so the heat-dissipation efficiency of product is very low. Moreover, it will cause the over-temperature of the high-temperatured heat flow area. When the high-temperatured heat flow area is close to the important electronic components on the printed circuit board, the adapter 1 will be broken easily or its lifespan will be shortened due to the over-temperature condition, and even more, a fire accident may occur. Therefore, it is needed to provide an electronic device with uniform heat-dissipation to overcome the above defects of the prior art.

SUMMARY OF THE INVENTION

An object of the present invention is to provide an electronic device with uniform heat-dissipation, which comprises the matching structures of the metal shielding and the housing, so as to overcome the defects of poor heat-dissipation efficiency and nonuniform temperature distribution of the conventional electronic device due to the high thermal resistance in the space formed between the inner side of the housing and the side of the printed circuit board assembly.

According to an aspect of the present invention, there is provided an electronic device with uniform heat-dissipation. The electronic device comprises a housing, a circuit board, and a metal shielding. The housing has concavities at inner sides thereof, and the circuit board is disposed within the housing. The metal shielding is disposed between the housing and the circuit board and has protrusions at outer sides thereof to match up the concavities of the housing. Thereby, the metal shielding substantially stays close to the housing for allowing the electronic device to dissipate heat uniformly.

In an embodiment, the electronic device is an adaptor, a power supply or a charger.

In an embodiment, the housing comprises an upper housing and a lower housing, and the concavities are disposed on at least one of the upper housing and the lower housing.

In an embodiment, the circuit board further comprises a plurality of electronic components thereon.

In an embodiment, the metal shielding comprises an upper shielding and a lower shielding, and each of the upper shielding and the lower shielding is formed by bending a metal plate.

In an embodiment, the protrusions are disposed on at least one of the upper shielding and the lower shielding.

In an embodiment, the metal shielding and the protrusions are integrally formed by bending a metal plate.

In an embodiment, the electronic device with uniform heat-dissipation further comprises an insulation sheath disposed between the circuit board and the metal shielding.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

The present invention relates to an electronic device with uniform heat-dissipation. The present techniques are illustrated with the following embodiments for an adapter, but the electronic device that is applicable to the present techniques is not limited to the adapter. Any electronic device, such as a power supply or a charger, which is applicable to the following techniques, is incorporated herein for reference.

Figure 2:
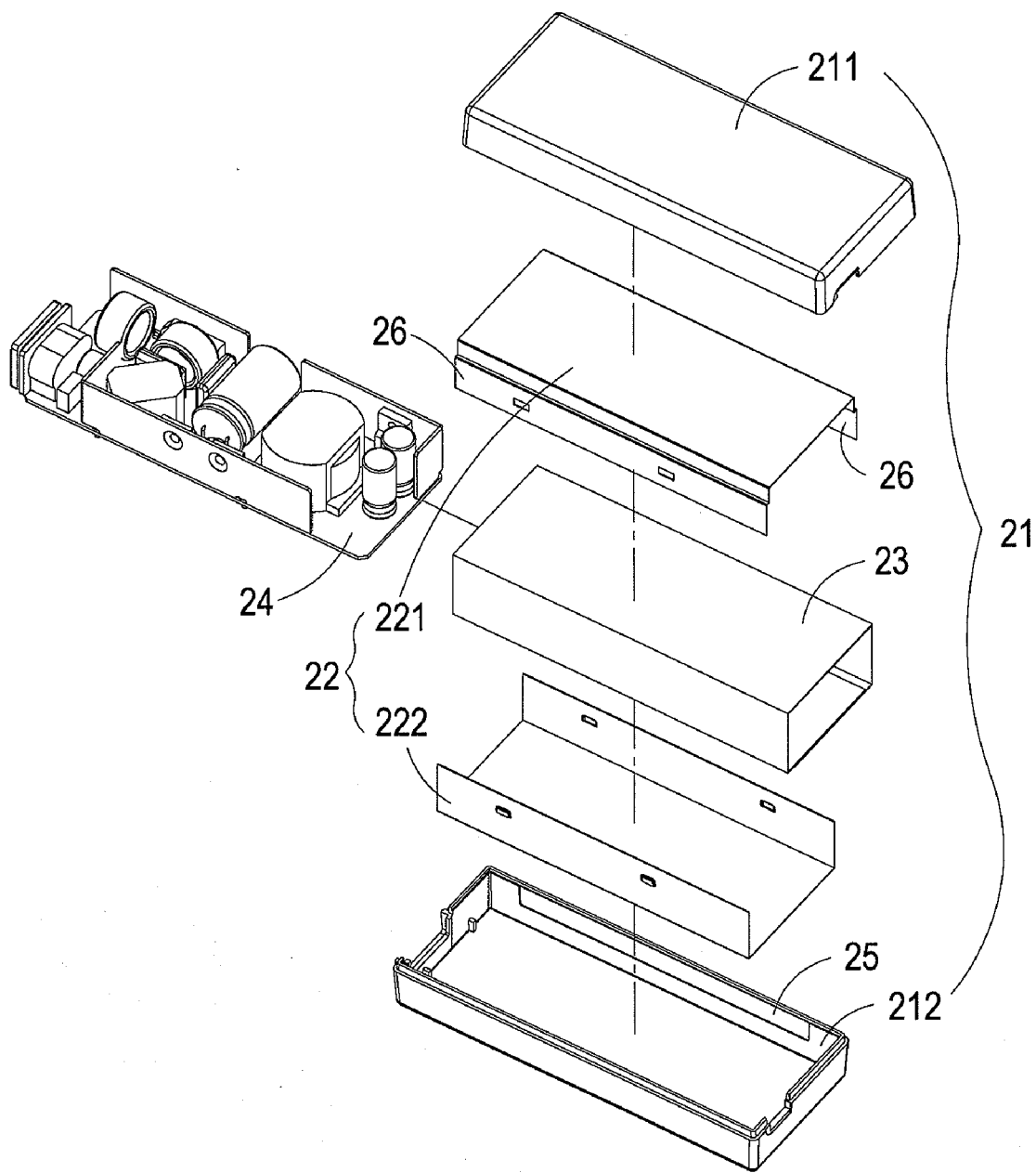
FIG. 2 is an exploded view showing the electronic device with uniform heat-dissipation according to the preferred embodiment of the present invention.

Please refer to FIG. 2, which is an exploded view showing the electronic device with uniform heat-dissipation according to the preferred embodiment of the present invention. As shown in FIG. 2, the electronic device is an adapter 2, which comprises a housing 21, a circuit board 24, a metal shielding 22 and an insulation sheath 23. The housing 21 is composed of an upper housing 211 and a lower housing 212. The metal shielding 22 is composed of an upper shielding 221 and a lower shielding 222, and is served as a protective cover from electromagnetic interference (EMI). The insulation sheath 23 is disposed between the upper shielding 221 and the lower shielding 222 and receives the circuit board 24 therein to insulate the circuit board 24 and protect the electronic device.

Figure 3A:
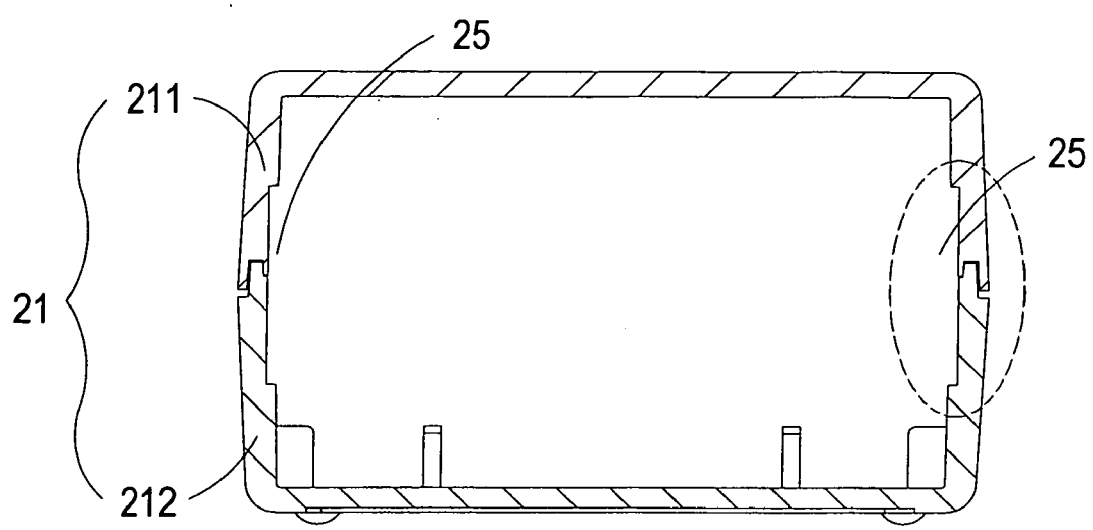
FIG. 3(a) is a cross-section view showing the housing of the electronic device with uniform heat-dissipation according to the preferred embodiment of the present invention.
Figure 3B:
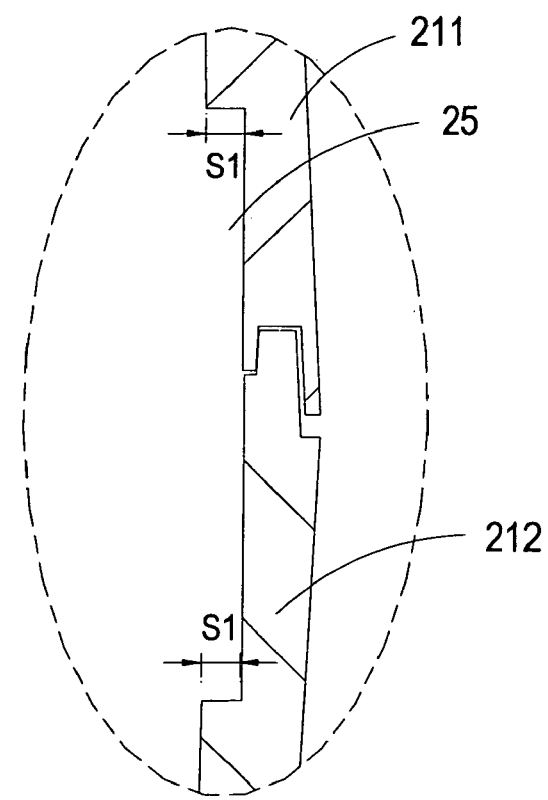
FIG. 3(b) is a partial enlargement view of FIG. 3(a)

The assembly of the above components is described in detail as follows. Please refer to FIG. 2 and FIGS. 3(a) and 3(b), wherein FIG. 3(a) is a cross-section view showing the housing of the electronic device with uniform heat-dissipation according to the preferred embodiment of the present invention, and FIG. 3(b) is a partial enlargement view of FIG. 3(a). As shown in the figures, the housing 21 is composed of the upper housing 211 and the lower housing 212, and has two concavities 25 with depth S1 at two opposite inner sides of the housing 21 where the upper housing 211 and the lower housing 212 are assembled.

Figure 3C:
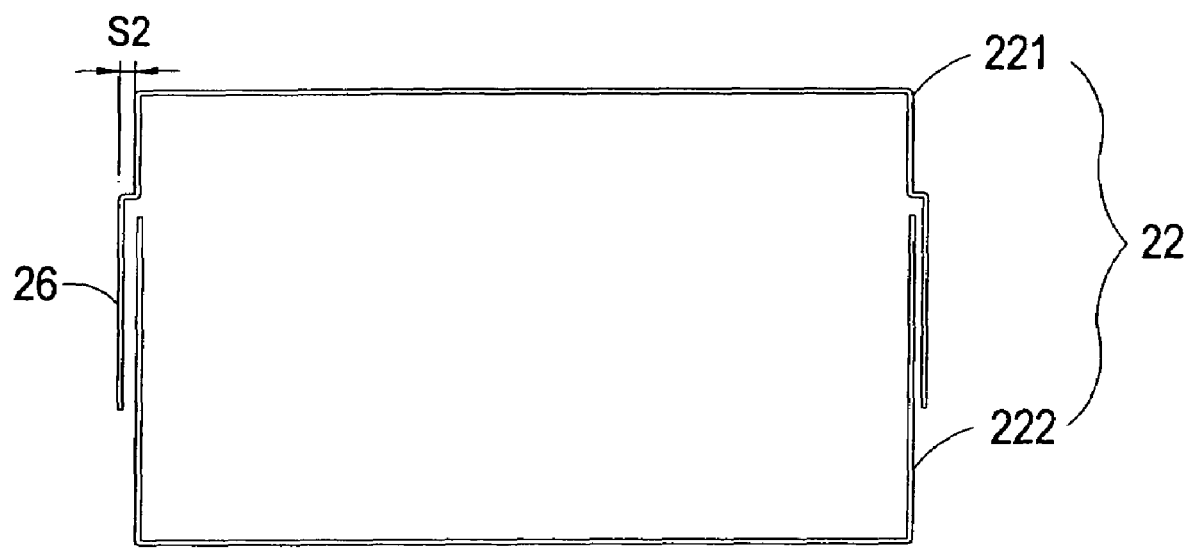
FIG. 3(c) is a schematic view showing the metal shielding of the electronic device with uniform heat-dissipation according to the preferred embodiment of the present invention.

Please refer to FIG. 3(c), which is a schematic view showing the metal shielding of the electronic device with uniform heat-dissipation according to the preferred embodiment of the present invention. As shown in FIG. 3(c), the metal shielding 22 is composed of the upper shielding 221 and the lower shielding 222, wherein each of the upper shielding 221 and the lower shielding 222 is formed by bending a metal plate, respectively. The upper shielding 221 further has two protrusions 26 with height S2 at two opposite sides, respectively, which are extended outwardly to match up the concavities 25 of the housing 21 shown in FIG. 3(a). Certainly, the bending manner of the metal shielding 22 can be changed variously, as long as it can form two protrusions 26 at two opposite sides, respectively, to match up the concavities 25 of the housing 21. In addition, the two protrusions 26 can also be disposed on two sides of the lower shielding 222, or one of the two protrusions 26 is disposed on one side of the upper shielding 221 and the other one is disposed on the opposite side of the lower shielding 222.

Figure 1:
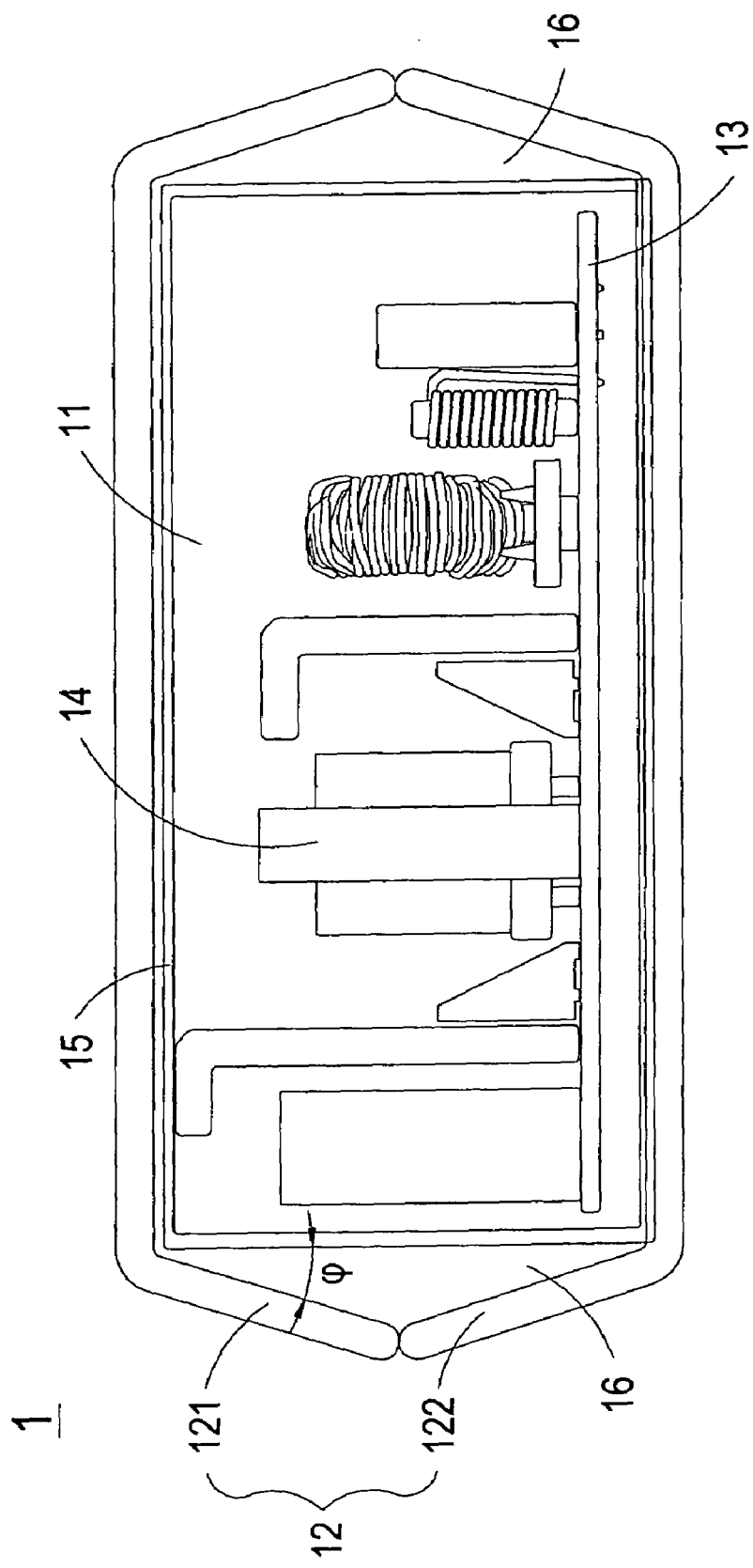
FIG. 1 is a cross-section view showing the structure of the conventional adapter.
Figure 4A:
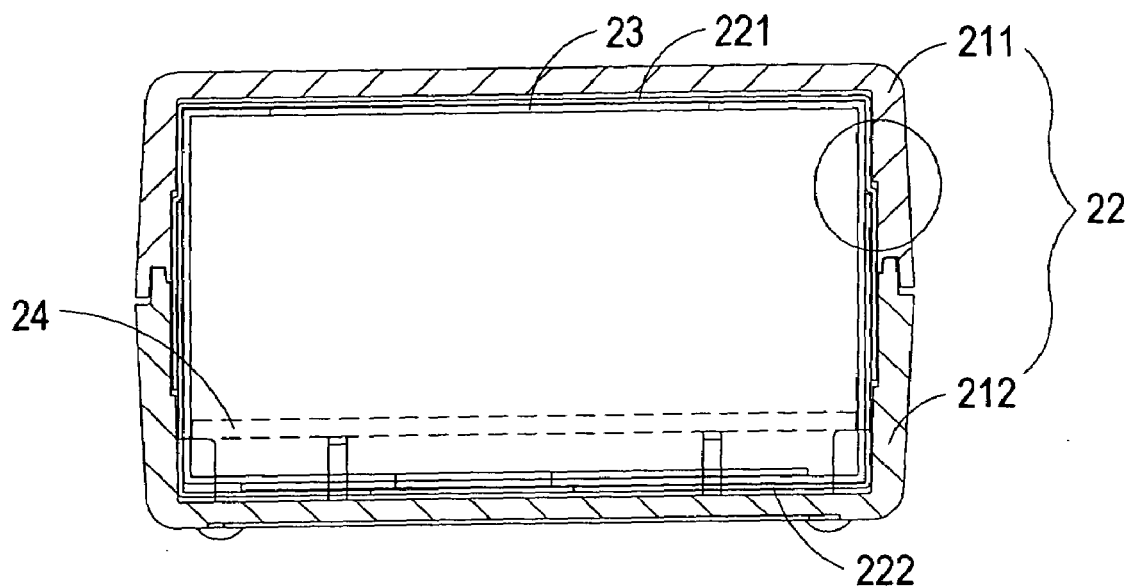
FIG. 4(a) is a cross-section view showing the assembled structure of the electronic device with uniform heat-dissipation according to the preferred embodiment of the present invention.
Figure 4B:
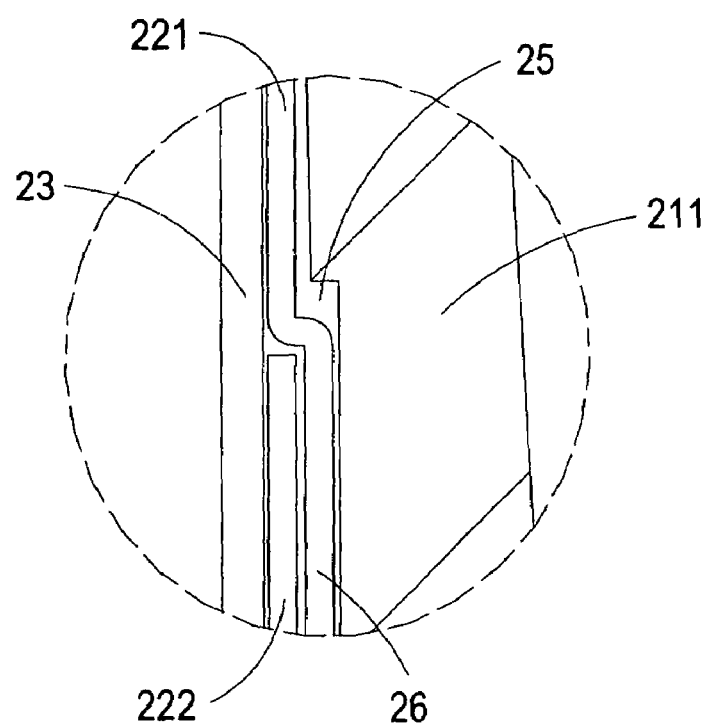
FIG. 4(b) is a partial enlargement view of FIG. 4(a)

Please refer to FIGS. 4(a) and 4(b), wherein FIG. 4(a) is a cross-section view showing the assembled structure of the electronic device with uniform heat-dissipation according to the preferred embodiment of the present invention, and FIG. 4(b) is a partial enlargement view of FIG. 4(a). According to the above descriptions, since the structures of the concavities 25 of the housing 21 and the protrusions 26 of the metal shielding 22 match up each other, the metal shielding 22 and the housing 21 can tightly stay close to each other and the distance between the metal shielding 22 and the housing 21 is greatly reduced when assembled. Compared with the prior art shown in FIG. 1, the space 16 originally formed between the inner side surface of the housing 12 and the metal cover 11 is filled up, that is to say, in the present invention, the air existing in the space between metal shielding 22 and the housing 21 is greatly reduced, so as to reduce the thermal resistance in this area. Therefore, the heat generated from the circuit board 24 during operation can be dissipated through both top areas and side areas of the housing 21 without the obstruction of air.

In other words, when the electronic device is connected between the electronic product and the commercial power source and under operation, since the inner side surface of the housing 21 and the outer side surface of the metal shielding 22 are substantially close to each other and nearly no air exists there between to block the heat-dissipation pathway, the thermal resistance in the heat-dissipation pathway through the side areas of the circuit board 24 is much lower than that of the prior art. Accordingly, the heat flow can uniformly flow from the electronic components of the circuit board 24 through the top areas and the side areas of the housing 21 to be further dissipated, and thus, the heat-dissipation efficiency of the electronic device can be increased and the defect of nonuniform temperature distribution can be avoided.

Figure 5A:
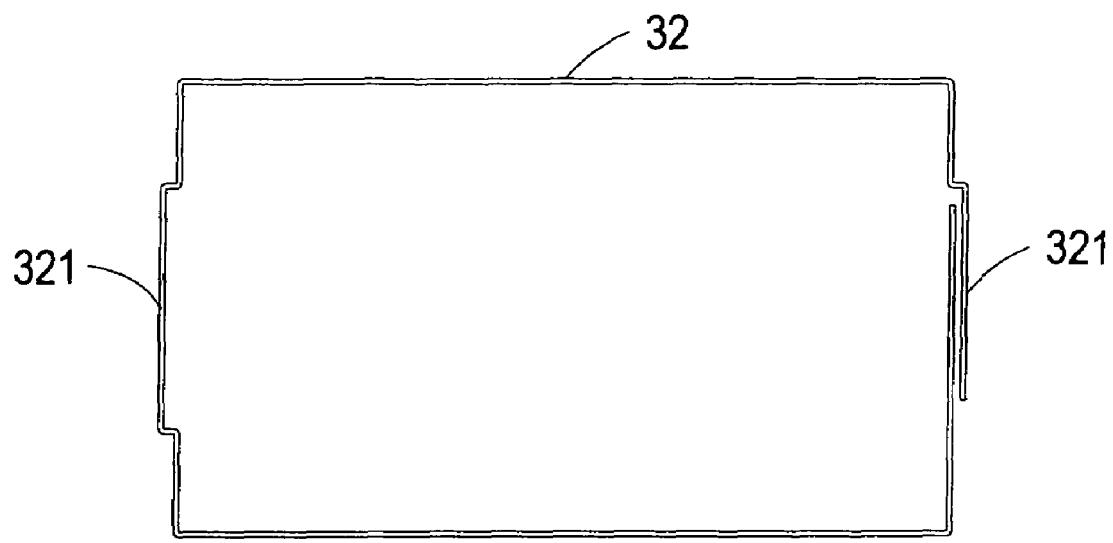
FIG. 5(a) is a schematic view showing the metal shielding of the electronic device with uniform heat-dissipation according to the second preferred embodiment of the present invention.
Figure 5B:
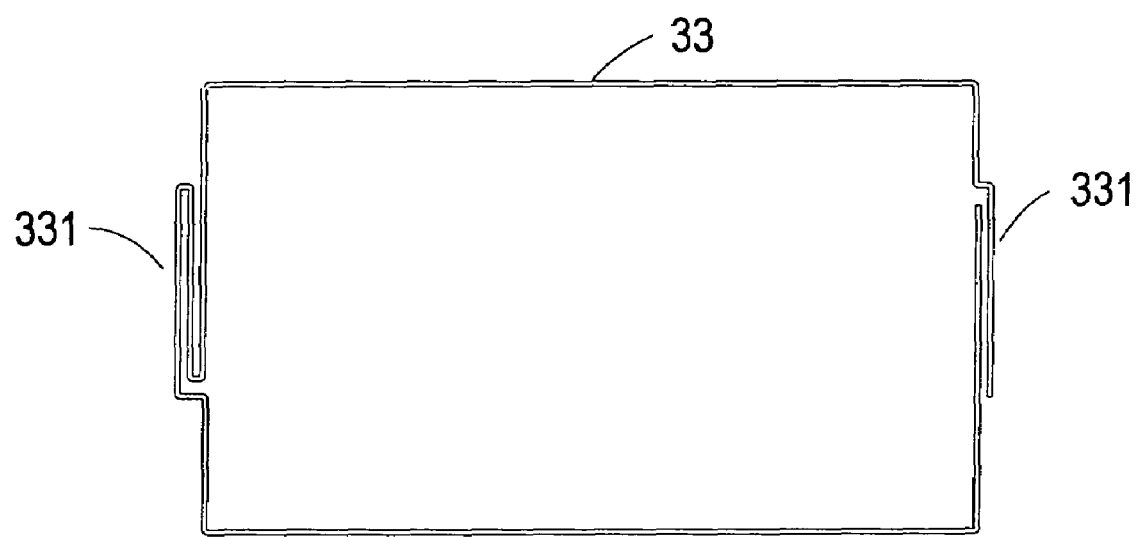
FIG. 5(b) is a schematic view showing the metal shielding of the electronic device with uniform heat-dissipation according to the third preferred embodiment of the present invention.

Moreover, in some embodiments, the metal shielding of the electronic device with uniform heat-dissipation according to the present invention can be designed in other ways. Please refer to FIGS. 5(a) and 5(b), which are schematic views showing the metal shielding of the electronic device with uniform heat-dissipation according to the second and the third preferred embodiments of the present invention, respectively. As shown in FIG. 5(a), the metal shielding 32 and the protrusions 321 are integrally formed by bending the same metal plate. Similarly, the metal shielding 33 and the protrusions 331 are integrally formed by bending the same metal plate, only with slight change in the bending manner of the protrusion 331. Both designs achieve the purpose of forming protrusions that match up the concavities of the housing to eliminate the space formed in the prior art and prevent the air in the space from reducing the heat-dissipation efficiency. Therefore, no matter how the metal shielding is formed, the main idea of the present invention is to form a metal shielding that is able to match up the structure of the concavities of the housing, and any way to achieve such idea is included in the technical scope of the present invention.

In conclusion, the electronic device with uniform heat-dissipation of the present invention is characterized in that the metal shielding of the electronic device has protrusions at the two sides that match up and stay close to the concavities at the two sides of the housing, so that the space formed between the housing and the metal cover in the conventional electronic device is no longer existing without adding any element or material. Thus, the thermal resistance at the side areas is decreased and the proportion of the heat flow flowing through the side areas of the electronic device is increased, and also, the heat-dissipation area is increased, as well as the heat-dissipation efficiency. Furthermore, the heat flow originally flowing to the top of the housing will partially transferred to the sides of the housing, so that the temperature of the electronic device can be homogenized, and the temperature of the electronic components in the interior of the electronic device will not exceed the safety standard due to over-temperature condition in local to avoid the electronic device from breakdown and the lifespan thereof to be shortened. Besides, such design does not increase the assembling steps and the material cost. Therefore, the electronic device with uniform heat-dissipation of the present invention possesses high industrial value.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic device with uniform heat-dissipation, comprising:
   a housing comprising a first housing and a second housing and having concavities at inner sides where said first housing and said second housing assembled;
   a circuit board disposed within said housing; and
   a metal shielding disposed between said housing and said circuit board and having protrusions at outer sides thereof to match up said concavities of said housing;
   thereby, said metal shielding substantially stays close to said housing for allowing said electronic device to dissipate heat uniformly.

2. The electronic device with uniform heat-dissipation according to claim 1 wherein said electronic device is an adaptor, a power supply or a charger.

3. The electronic device with uniform heat-dissipation according to claim 1 wherein said first housing is an upper housing and said second housing is a lower housing.

4. The electronic device with uniform heat-dissipation according to claim 3 wherein said concavities are disposed on at least one of said upper housing and said lower housing.

5. The electronic device with uniform heat-dissipation according to claim 1 wherein said circuit board further comprises a plurality of electronic components thereon.

6. The electronic device with uniform heat-dissipation according to claim 1 wherein said metal shielding comprises an upper shielding and a lower shielding.

7. The electronic device with uniform heat-dissipation according to claim 6 wherein each of said upper shielding and said lower shielding is formed by bending a metal plate.

8. The electronic device with uniform heat-dissipation according to claim 6 wherein said protrusions are disposed on at least one of said upper shielding and said lower shielding.

9. The electronic device with uniform heat-dissipation according to claim 1 wherein said metal shielding and said protrusions are integrally formed by bending a metal plate.

10. The electronic device with uniform heat-dissipation according to claim 1 further comprising an insulation sheath disposed between said circuit board and said metal shielding.

* * * * *